(12) United States Patent
Kim

(10) Patent No.: US 9,368,657 B2
(45) Date of Patent: Jun. 14, 2016

(54) SOLAR CELL

(71) Applicant: SAMSUNG SDI CO., LTD., Yongin-si, Gyeonggi-do (KR)

(72) Inventor: Dong-Jin Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 288 days.

(21) Appl. No.: 13/828,851

(22) Filed: Mar. 14, 2013

(65) Prior Publication Data

US 2014/0124023 A1    May 8, 2014

Related U.S. Application Data

(60) Provisional application No. 61/723,666, filed on Nov. 7, 2012.

(51) Int. Cl.
*H01L 31/044* (2014.01)
*H01L 31/0224* (2006.01)
*H01L 31/0465* (2014.01)

(52) U.S. Cl.
CPC ...... *H01L 31/02245* (2013.01); *H01L 31/0465* (2014.12); *Y02E 10/541* (2013.01)

(58) Field of Classification Search
CPC ........ H01L 31/00–31/078; Y02E 10/50–10/60
USPC ................................. 136/243–265
See application file for complete search history.

(56) References Cited

U.S. PATENT DOCUMENTS

| 4,758,526 A * | 7/1988 | Thalheimer ........... H01L 31/046 136/244 |
| 2008/0196756 A1* | 8/2008 | Basol .................. H01L 31/0322 136/244 |
| 2009/0069069 A1 | 3/2009 | Crowder, Jr. et al. |
| 2010/0218827 A1* | 9/2010 | Aono ..................... C25D 11/02 136/264 |
| 2010/0243043 A1* | 9/2010 | Chuang .................. C23C 10/30 136/256 |
| 2012/0021536 A1* | 1/2012 | Feldman-Peabody ............... H01L 31/073 438/5 |

FOREIGN PATENT DOCUMENTS

| KR | 10-2009-0123645 A | 12/2009 |
| KR | 10-2011-0066260 A | 6/2011 |
| KR | 10-2012-0081899 A | 7/2012 |

* cited by examiner

*Primary Examiner* — Bach Dinh
(74) *Attorney, Agent, or Firm* — Lewis Roca Rothgerber Christie LLP

(57) ABSTRACT

A solar cell and a method of fabricating a solar cell. A solar cell including a substrate; a first electrode layer on the substrate; a light absorbing layer on the first electrode layer; an alloy layer between the first electrode layer and the light absorbing layer; a buffer layer on the light absorbing layer; a first through-hole formed through the buffer layer, the light absorbing layer, the alloy layer, and the first electrode layer to the substrate; and an insulating barrier in at least one portion of the first through-hole.

12 Claims, 6 Drawing Sheets

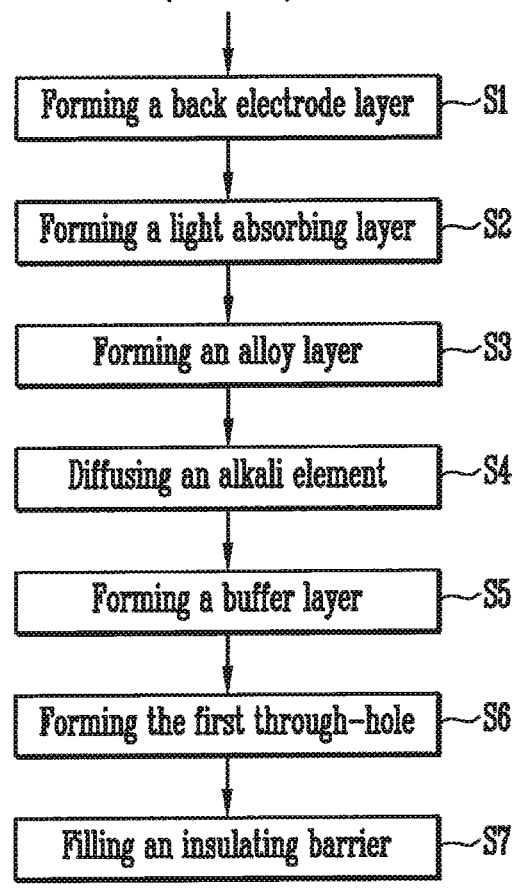
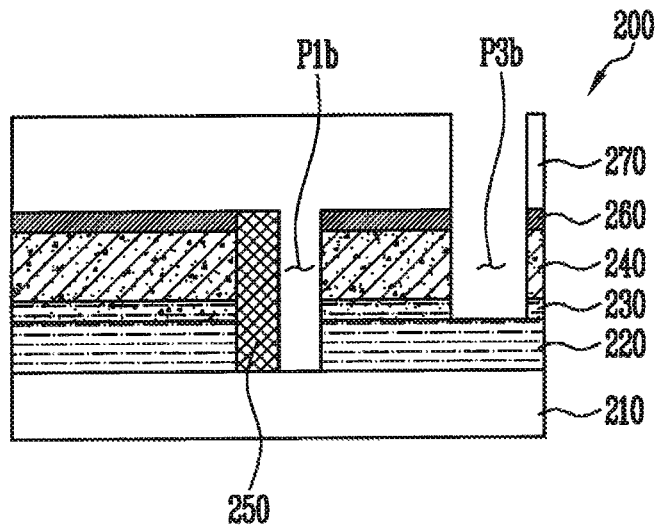

SOLAR CELL

CROSS-REFERENCE TO RELATED APPLICATION

This application claims priority to and the benefit of U.S. Provisional Application No. 61/723,666, filed on Nov. 7, 2012 in the United States Patent & Trademark Office, the entire content of which is incorporated herein by reference.

BACKGROUND

1. Field

Aspects of embodiments of the present invention relate to a solar cell.

2. Description of the Related Art

As demands on energy increase, demands on solar cells for converting sunlight energy into electrical energy have recently been increased. The solar cells are clean energy sources that produce electricity from the sunlight as an infinite energy source. The solar cells have come into the spotlight with a high industrial growth rate in recent years.

A copper-indium-gallium-(di)selenide (CIGS) solar cell is a solar cell that can be implemented as a thin film and does not use silicon (Si). Thus, it is expected that the CIGS solar cell will play an important role in the spread of sunlight energy use by lowering production cost of solar cells. Further, it is known that since the CIGS solar cell is thermally stable, a decrease in efficiency hardly exists as time elapses. Therefore, various studies have been conducted to increase power-generating capacity of the CIGS solar cell.

SUMMARY

According to an aspect of embodiments of the present invention, a solar cell has a novel structure.

According to another aspect of embodiments of the present invention, a solar cell has improved power generation efficiency.

According to an embodiment of the present invention, a solar cell includes: a substrate; a first electrode layer on the substrate; a light absorbing layer on the first electrode layer; an alloy layer between the first electrode layer and the light absorbing layer; a buffer layer on the light absorbing layer; a first through-hole formed through the buffer layer, the light absorbing layer, the alloy layer, and the first electrode layer to the substrate; and an insulating barrier in at least one portion of the first through-hole.

The insulating barrier may include at least one of $SiO_2$, $SiO_y$, $SiN_z$, or SiON, where y and z are natural numbers.

An interface of the insulating barrier may be formed in parallel with an interface of the buffer layer, adjacent to the interface of the insulating barrier.

The solar cell may further include an alkali element diffused from the substrate into the light absorbing layer, the light absorbing layer including a CIGS compound.

The insulating barrier may fill the first through-hole.

The solar cell may further include a second electrode layer on the buffer layer.

In one embodiment, a second through-hole is formed through the buffer layer and the light absorbing layer to the alloy layer, the second through-hole being spaced apart from the first through-hole in a first direction, and the second electrode layer contacts the alloy layer through the second through-hole.

A third through-hole may be formed through the second electrode layer, the buffer layer, the light absorbing layer, and the alloy layer to the first electrode layer, the third through-hole being spaced apart from the second through-hole in the first direction.

A second through-hole may be formed through the second electrode layer, the buffer layer, the light absorbing layer, and the alloy layer to the first electrode layer, the second through-hole being spaced apart from the first through-hole in a first direction.

The insulating barrier may partially fill the first through-hole, and the second electrode layer may fill a remaining portion of the first through-hole.

The insulating barrier may be at a first side of the first through-hole, and the second electrode layer may be at a second side of the first through-hole, the second side being spaced from the first side in the first direction.

At least a portion of an inner surface defining the first through-hole may be inclined with respect to a surface of the substrate.

The at least a portion of the inner surface defining the first through-hole may be inclined at an angle of 30 to 60 degrees with respect to the surface of the substrate.

A width of a portion of the first through-hole that is adjacent the substrate may be about half of a width of another portion of the first through-hole that is at an interface with the buffer layer.

According to another embodiment of the present invention, a method of fabricating a solar cell includes: providing a first electrode layer on a substrate; providing a light absorbing layer on the first electrode layer; forming an alloy layer between the first electrode layer and the light absorbing layer; providing a buffer layer on the light absorbing layer; and forming a first through-hole through the buffer layer, the light absorbing layer, the alloy layer, and the first electrode layer to the substrate.

The method may further include providing an insulating barrier in at least one portion of the first through-hole.

In one embodiment, the method further includes diffusing an alkali element of the substrate into the light absorbing layer, and the diffusing the alkali element into the light absorbing layer is performed before the forming the first through-hole.

The method may further include providing a second electrode layer on the buffer layer.

In one embodiment, the method further includes forming a second through-hole through the second electrode layer, the buffer layer, the light absorbing layer, and the alloy layer to the first electrode layer, the second through-hole being spaced apart from the first through-hole in a first direction; and filling an insulating barrier in a first side of the first through-hole, and filling the second electrode layer in a second side of the first through-hole, the second side being spaced from the first side in the first direction.

At least a portion of an inner surface defining the first through-hole may be inclined with respect to a surface of the substrate.

According to another embodiment of the present invention, a solar cell includes: a substrate; a back electrode layer formed on the substrate; a light absorbing layer formed on the back electrode layer; an alloy layer formed on a surface of the back electrode layer between the back electrode layer and the light absorbing layer; a buffer layer formed on the light absorbing layer; a first through-hole that exposes at least one portion of the substrate by passing through the buffer layer and the back electrode layer; and an insulating barrier formed to cover at least a portion in the first through-hole.

The first through-hole may be formed to pass through the buffer layer, the back electrode layer, the light absorbing layer interposed between the buffer layer and the back electrode layer, and the alloy layer.

The insulating barrier may be formed to cover a top surface of the substrate and side surfaces of the buffer layer, the light absorbing layer, the alloy layer and the back electrode layer by being filled in the first through-hole.

An interface of the insulating barrier may be formed in parallel with an interface of the buffer layer, adjacent to the interface of the insulating barrier.

The solar cell may further include a second through-hole spaced apart from the through-hole in a first direction, and the second through-hole may expose at least one portion of the alloy layer by passing through the buffer layer and the light absorbing layer.

The solar cell may further include a front electrode layer formed on the buffer layer, and the front electrode layer may be formed to cover a top surface of the alloy layer and side surfaces of the buffer layer and the light absorbing layer by being filled in the second through-hole.

The solar cell may further include a third through-hole spaced apart from the second through-hole in the first direction, and the third through-hole may expose at least one portion of the back electrode layer by passing through the front electrode layer, the buffer layer, the light absorbing layer and the alloy layer.

The substrate may be a glass substrate containing an alkali metal.

The alkali metal of the substrate may be diffused into the back electrode layer, the alloy layer and the light absorbing layer, which are formed on the substrate.

The insulating barrier may include at least one of $SiO_2$, $SiO_y$, $SiN_z$ or $SiON$ (here, y and z are natural numbers).

The solar cell may further include a third through-hole spaced apart from the first through-hole in the first direction, and the third through-hole may expose at least one portion of the back electrode layer by passing through the front electrode layer, the buffer layer, the light absorbing layer and the alloy layer.

The first through-hole may include first and second surfaces sequentially formed in the first direction so as to be opposite to each other. The second surface may be formed adjacent to the third through-hole, and the insulating barrier may cover the first surface and the top surface of the substrate, adjacent to the first surface.

The solar cell may further include a front electrode layer formed on the buffer layer, and the front electrode layer may be formed to cover the second surface of the first through-hole and the top surface of the substrate, adjacent to the second surface.

At least one portion of the inner wall of the first through-hole may be formed to be inclined.

The first through-hole may be formed such that the width of the first through-hole is narrowed in a direction toward the back electrode layer from the buffer layer, and the section of the first through-hole may be formed in a trapezoid shape.

The first through-hole may include first and second surfaces sequentially formed in the first direction so as to be opposite to each other. The second surface may be formed adjacent to the third through-hole, and the insulating barrier may cover the first surface and a portion of the substrate, adjacent to the first surface.

The first or second surface of the first through-hole may be formed to have an inclination angle of 30 to 60 degrees with respect to the substrate.

As described above, according to an aspect of embodiments of the present invention, a solar cell is provided having a novel structure.

Further, according to another aspect of embodiments of the present invention, a solar cell is provided having improved power generation efficiency.

BRIEF DESCRIPTION OF THE DRAWINGS

The accompanying drawings, together with the specification, illustrate some exemplary embodiments of the present invention, and, together with the description, serve to explain aspects and principles of the present invention.

FIG. 4 is a flowchart illustrating a method of fabricating a solar cell, according to an embodiment of the present invention.

FIG. 5 is a sectional view of a solar cell according to another embodiment of the present invention.

DETAILED DESCRIPTION

Figure 1:
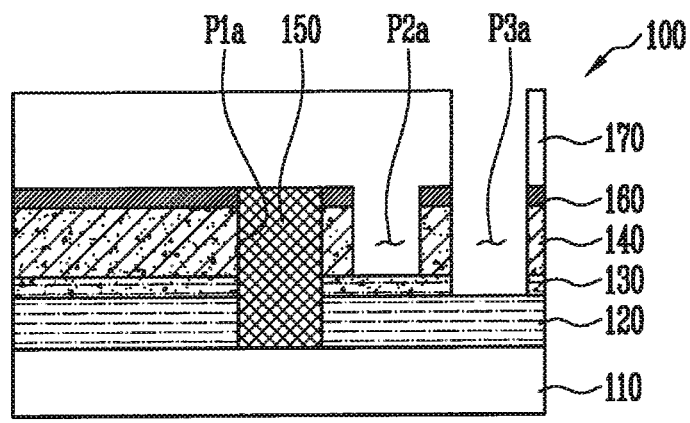
FIG. 1 is a sectional view of a solar cell according to an embodiment of the present invention.

In the following detailed description, certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or indirectly on the another element with one or more intervening elements interposed therebetween. Also, when an element is referred to as being "connected to" another element, it can be directly connected to the another element or indirectly connected to the another element with one or more intervening elements connected therebetween. Like reference numerals refer to like elements herein.

Some exemplary embodiments of the present invention are described in further detail below with reference to the accompanying drawings.

FIG. 1 is a sectional view of a solar cell according to an embodiment of the present invention.

A solar cell 100 according to an embodiment of the present invention includes a substrate 110; a back electrode layer 120 (e.g., a first electrode layer) formed on the substrate 110; a light absorbing layer 140 formed on the back electrode layer 120; an alloy layer 130 formed on a surface of the back electrode layer 120 between the back electrode layer 120 and the light absorbing layer 140; a buffer layer 160 formed on the light absorbing layer 140; a first through-hole P1a that exposes at least one portion of the substrate 110 by passing through the buffer layer 160, the light absorbing layer 140, the alloy layer 130, and the back electrode layer 120; and an insulating barrier 150 formed to cover at least one portion in the first through-hole P1a. The first through-hole P1a may be formed to pass through the buffer layer 160, the back electrode layer 120, the light absorbing layer 140 formed between the buffer layer 160 and the back electrode layer 120 and the alloy layer 130. In one embodiment, a front electrode layer 170 (e.g., a second electrode layer) may be formed on the buffer layer 160.

The substrate 110 may be a glass substrate, ceramic substrate, metal substrate, polymer substrate, etc. In one embodiment, for example, the substrate 110 may be a glass substrate including one or more alkali elements, such as sodium (Na), potassium (K) or cesium (Cs), therein. In one embodiment, the substrate 110 may be a soda-lime glass substrate or a high-strain point soda glass substrate.

The back electrode layer 120 may be made of a conductor such as metal. For example, the back electrode layer 120 may be made of a material having excellent stability at a high temperature and high electrical conductivity. The back electrode layer 120 may be formed using a material having excellent adhesion with the substrate 110 and the light absorbing layer 140, respectively formed at top and bottom portions of the back electrode layer 120. In one embodiment, the back electrode layer 120 may be made of molybdenum (Mo).

The light absorbing layer 140 may be formed of a Group I-III-VI based compound semiconductor or Group I-II-IV-VI based compound semiconductor. Here, the Group I element may be any one of copper (Cu), silver (Ag), gold (Au), etc., and the Group II element may be any one of zinc (Zn), cadmium (Cd), etc. The Group III element may be any one of indium (In), gallium (Ga), aluminum (Al), etc., and the Group IV element may be any one of silicon (Si), germanium (Ge), tin (Sn), lead (Pb), etc. The Group VI element may be any one of sulfur (S), selenium (Se), tellurium (Te), etc.

In one embodiment, for example, the Group I-III-VI based compound semiconductor may be a compound semiconductor such as CIS, CGS, or CIGS (here, C denotes copper (Cu), I denotes indium (In), G denotes gallium (Ga), and S denotes one or more of sulfur (S) or selenium (Se)). The Group I-II-IV-VI based compound semiconductor may be a compound semiconductor such as CZTS (here, C denotes copper (Cu), Z denotes zinc (Zn), T denotes tin (Sn), and S denotes one or more of sulfur (S) or selenium (Se)).

The alloy layer 130 is formed at an interface at which the light absorbing layer 140 and the back electrode layer 120 contact each other. The alloy layer 130, in one embodiment, may be formed through a selenization process. For example, the light absorbing layer 140 formed of the CIGS based compound semiconductor may be formed by a layer made of copper (Cu), indium (In), gallium (Ga) and sulfur (S) on the back electrode layer 120 and then allowing the layer to react with selenium (Se). In one embodiment, the selenium (Se) is diffused from an upper surface of the light absorbing layer 140 so as to pass through the light absorbing layer 140, and then reacts with the surface of the back electrode layer 120 contacting the light absorbing layer 140, thereby forming the alloy layer 130. For example, in a case where the back electrode layer 120 is formed of molybdenum (Mo), the alloy layer 130 may be formed of molybdenum diselenide ($MoSe_2$).

The buffer layer 160 may be formed with at least one layer on the light absorbing layer 140. In one embodiment, the light absorbing layer 140 formed beneath the buffer layer 160 acts as a p-type semiconductor, and the front electrode layer 170 formed on the buffer layer 160 acts as an n-type semiconductor. Therefore, a p-n junction may be formed between the light absorbing layer 140 and the front electrode layer 170. In this case, the buffer layer 160 may be formed to have a middle band gap between the light absorbing layer 140 and the front electrode layer 170, such that excellent adhesion between the light absorbing layer 140 and the front electrode layer 170 is possible. For example, the buffer layer 160 may be made of cadmium sulfide (CdS), zinc sulfide (ZnS), etc.

The front electrode layer 170 is a conductive layer and may act as an n-type semiconductor. In one embodiment, for example, the front electrode layer 170 may be made of a transparent conductive oxide (TCO). In one embodiment, the front electrode layer 170 may be made of zinc oxide (ZnO).

The solar cell 100 according to one embodiment may include a patterning process performed three times or more. The solar cell 100 according to this embodiment may include first to third through-holes P1a, P2a, and P3a sequentially formed in a first direction through the patterning process. The patterning process may be performed by removing a partial region of one or more layers stacked on the substrate 110 using a mechanical or laser apparatus.

The first through-hole P1a may expose a top surface of the substrate 110 by forming the first through-hole P1a up to the buffer layer 160 on the substrate 110 and passing through the buffer layer 160, the light absorbing layer 140, the alloy layer 130, and the back electrode layer 120 through the patterning process.

The solar cell 100, in one embodiment, further includes a second through-hole P2a spaced apart from the first through-hole P1a in the first direction. The second through-hole P2a may expose at least one portion of the alloy layer 130 by passing through the buffer layer 160 and the light absorbing layer 140. In the solar cell 100, the front electrode layer 170 may be formed on the buffer layer 160. The front electrode layer 170 may be filled in the second through-hole P2a.

The third through-hole P3a is formed to be spaced apart from the second through-hole P2a in the first direction, and the second through-hole P2a may be formed between the first and third through-holes P1a and P3a. The third through-hole P3a may be insulated by forming the third through-hole P3a up to the front electrode layer 170, passing through the front electrode layer 170, the buffer layer 160, the light absorbing layer 140, and the alloy layer 130 through the patterning process so as to expose a top surface of the back electrode layer 120 and allowing the back electrode layer 120 to be spaced apart from the front electrode layer 170.

The insulating barrier 150 may be formed to cover at least one portion of the inside of the first through-hole P1a. The insulating barrier 150 may be made of an insulative material, such as using an inkjet printing method or other suitable method. In one embodiment, the insulating barrier 150 may include at least one of $SiO_2$, $SiO_y$, $SiN_z$, or SiON (here, y and z are natural numbers).

Figure 2A:
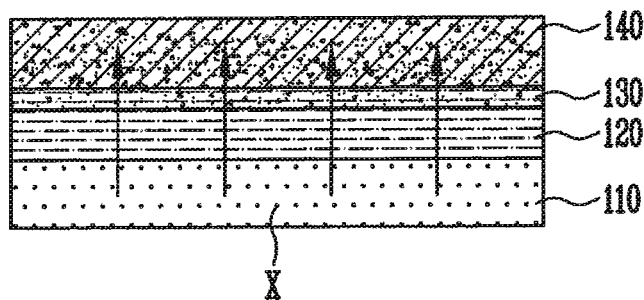
FIG. 2A is a sectional view schematically illustrating a state in which an alkali element is diffused in a solar cell according to an embodiment of the present invention.
Figure 2B:
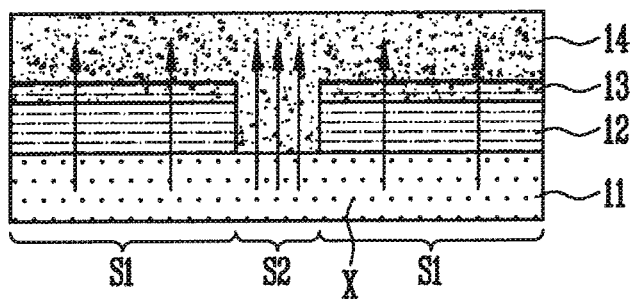
FIG. 2B is a sectional view schematically illustrating a state in which an alkali element is diffused in a conventional solar cell.

FIG. 2A is a sectional view schematically illustrating a state in which an alkali element is diffused in a solar cell according to an embodiment of the present invention. FIG. 2B is a sectional view schematically illustrating a state in which an alkali element is diffused in a conventional solar cell.

Referring to FIG. 2A, to improve efficiency of the solar cell 100, an alkali element X may be contained in the light absorbing layer 140 that acts as a power generation layer in the solar cell 100. In one embodiment, the light absorbing layer 140 may be formed using the substrate 110 in which the alkali element X is contained. In one embodiment, after the back electrode layer 120 and the light absorbing layer 140 are formed, the alkali element X is diffused up to the light absorbing layer 140 through heating, for example.

The alkali element X may be diffused into the light absorbing layer 140 by passing through the back electrode layer 120 and the alloy layer 130, sequentially formed on the substrate 110. In this case, since the alkali element X passes through individual layers having an approximately constant property on the substrate 110, the alkali element X can be diffused up to the light absorbing layer 140 at a similar or substantially constant speed or rate. Thus, the alkali element X may be uniformly or substantially uniformly contained in the light absorbing layer 140.

Referring to FIG. 2B which shows a conventional solar cell according to the related art, a lower metal layer 12, an alloy layer 13, and a light absorbing layer 14 may be formed on a substrate 11. In this case, a patterning process is performed on the lower metal layer 12, the alloy layer 13, and the light absorbing layer 14 on the substrate 11, and the region of the substrate 11 may be divided into first and second regions S1 and S2. While an alkali element X passes through the lower metal layer 12 and the alloy layer 13 and is then diffused into the light absorbing layer 14 in the first region S1 of the substrate 11, the alkali element X is directly diffused from the substrate 11 to the light absorbing layer 14 in the second region S2 of the substrate 11. Therefore, the content of the alkali element X contained in the light absorbing layer 14 formed at the first region S1 of the substrate 11 and the content of the alkali element X contained in the light absorbing layer 14 formed at the second region S2 of the substrate 11 are not uniform, and the alkali element X is excessively diffused into the light absorbing layer 14 at the second region S2. Further, an inequality of performance is caused in the light absorbing layer 14, and therefore, performance of the conventional solar cell is lowered.

On the other hand, in the solar cell according to embodiments of the present invention, the alkali element X contained in the substrate 110 may be diffused into the light absorbing layer 140 at an approximately same speed or rate without any difference between regions on the substrate 110. Thus, the alkali element X may be uniformly or substantially uniformly contained in the light absorbing layer 140, such that the solar cell can be efficiently used.

Figure 3A:
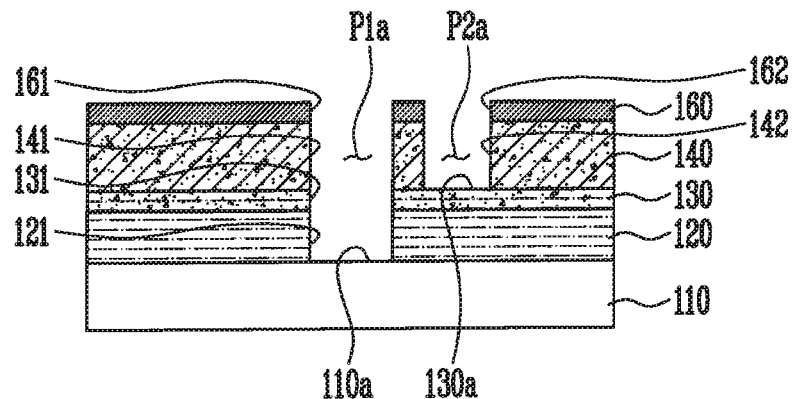
FIGS. 3A to 3C are sectional views schematically illustrating a method of fabricating the solar cell of FIG. 1, according to an embodiment of the present invention.
Figure 3B:
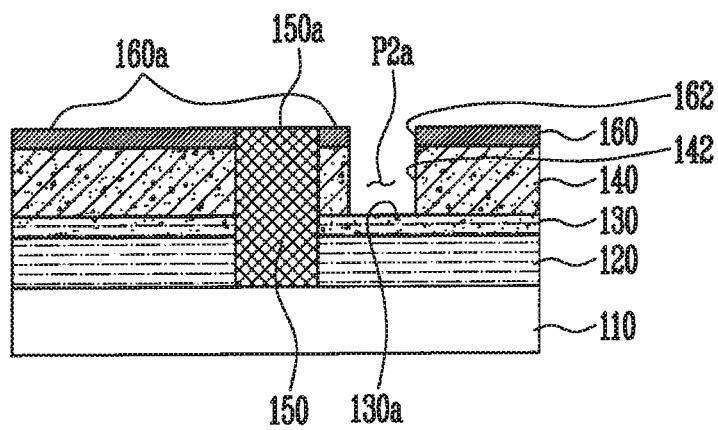
Figure 3C:
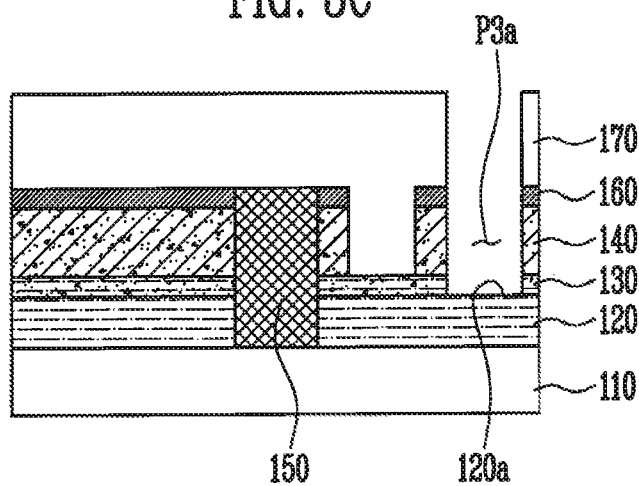

FIGS. 3A to 3C are views schematically illustrating a method of fabricating the solar cell of FIG. 1, according to an embodiment of the present invention.

Referring to FIG. 3A, in a solar cell according to an embodiment of the present invention, a back electrode layer 120, an alloy layer 130, a light absorbing layer 140, and a buffer layer 160 are formed on a substrate 110, and a first through-hole P1a is subsequently formed. The first through-hole P1a may be formed by passing through the buffer layer 160, the light absorbing layer 140, the alloy layer 130, and the back electrode layer 120 so as to expose a top surface 110a of the substrate 110. A second through-hole P2a may be formed to be spaced apart from the first through-hole P1a in a first direction. The second through-hole P2a may be formed by passing through the buffer layer 160 and the light absorbing layer 140 so as to expose a top surface 130a of the alloy layer 130.

Referring to FIGS. 3B and 3C, an insulating barrier 150 may be formed in the first through-hole P1a. The insulating barrier 150 may be formed to cover the top surface 110a of the substrate, a side surface 161 of the buffer layer 160, a side surface 141 of the light absorbing layer 140, a side surface 131 of the alloy layer 130, and a side surface 121 of the back electrode layer 120 by being filled in the first through-hole P1a. Thus, the back electrode layers 120 may be spaced apart from each other with a certain space interposed therebetween.

Typically, after a first through-hole is formed, a CIGS based material such as a light absorbing layer is filled between neighboring back electrode layers with a certain space interposed therebetween. Therefore, since the insulation between the neighboring back electrode layers may be broken by the light absorbing layer, there is an interval between the neighboring back electrode layers. In a case where the interval between the neighboring back electrode layers is too wide, it may be advantageous in the insulation between the neighboring back electrode layers. However, the power generation area of the solar cell per unit volume decreases, and therefore, the efficiency of the solar cell may be lowered.

On the other hand, in embodiments of the present invention, the insulating barrier 150 that is an insulative material is formed in the first through-hole P1a. Thus, although the first through-hole P1a may be formed to have a narrow width, the insulation between the neighboring back electrode layers 120 can be easily implemented. For example, in one embodiment, although the width of the first through-hole P1a may be decreased to 30 µm or less, the insulation between the neighboring back electrode layers 120 can be maintained. Thus, it is possible to increase the power generation area of the solar cell.

Referring to FIG. 3C, the solar cell may further include a front electrode layer 170 formed on the buffer layer 160. The front electrode layer 170 may be formed to cover a top surface 130a of the alloy layer 130, a side surface 162 of the buffer layer 160, and a side surface 142 of the light absorbing layer 140 by being filled in the second through-hole P2a. An interface 150a of the insulating barrier 150 according to one embodiment may be formed in parallel with an interface 160a of the buffer layer 160, adjacent to the interface 150a of the insulating barrier 150.

A front electrode layer 170 may be formed on the buffer layer 160 and the insulating barrier 150. If the interface 160a of the buffer layer 160, adjacent to the interface 150a of the insulating barrier 150, were not uniform, a stress may be applied to the front electrode layer 170 in an upper direction, and the stress could interfere with a control of the thickness of the front electrode layer, and therefore, a uniformity of the front electrode layer 170 could be lowered. In one embodiment, a third through-hole P3a may be formed to be spaced apart from the second through-hole P2a in the first direction. The third through-hole P3a may be formed by passing through the front electrode layer 170, the buffer layer 160, the light absorbing layer 140, and the alloy layer 130 so as to expose a top surface 120a of the back electrode layer 120.

Figure 3D:
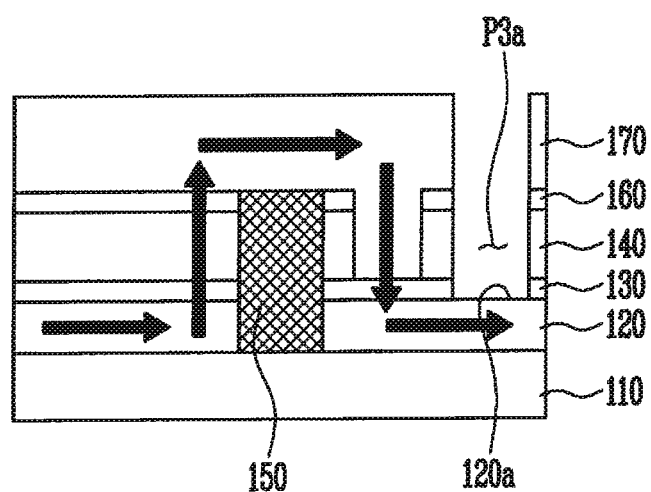
FIG. 3D is a schematic sectional view illustrating a state in which current flows in the solar cell of FIG. 1.

FIG. 3D is a schematic sectional view illustrating a state in which current flows in the solar cell of FIG. 1. Referring to FIG. 3D, in a solar cell according to one embodiment, such as the solar cell 100, the flow of current may pass through the light absorbing layer 140 and the buffer layer 160 from the back electrode layer 120 positioned at the front of the neighboring back electrode layers 120 with the insulating barrier 150 interposed therebetween, and may then be connected to the front electrode layer 170. Subsequently, the flow of current may be connected to the back electrode layer 120 positioned at the rear of the neighboring back electrode layers 120. That is, insulation between the neighboring back electrode layers 120 is provided by the insulating barrier 150 formed in the first through-hole P1a.

FIG. 4 is a flowchart illustrating a method of fabricating a solar cell, such as the solar cell of FIG. 1, according to an embodiment of the present invention.

Referring to FIG. 4, a process in which a first through-hole and an insulating barrier are filled in a solar cell according to an embodiment of the present invention is described as follows.

First, after a back electrode layer is formed by depositing molybdenum (Mo), etc. on a substrate (S1), a light absorbing layer may be formed, such as by depositing CIGS, on the back electrode layer (S2), and then performing a selenization process using selenium (Se). Subsequently, an alloy layer made of molybdenum diselenide ($MoSe_2$), in one embodiment, may be formed at an interface between the back electrode layer and the light absorbing layer (S3). After the alloy layer is formed, an alkali element existing in the substrate is diffused up to the light absorbing layer (S4), such as through heating. In one embodiment, a first through-hole is not formed through a patterning process for allowing the back electrode layers to be spaced apart from each other until after the process of diffusing the alkali element. In one embodiment, a patterning process is performed after the alkali element is diffused into the light absorbing layer and a buffer layer is then formed on the light absorbing layer (S5), thereby forming the first through-hole (S6). An insulating barrier made of $SiO_2$, etc. may be filled in the first through-hole (S7). The materials described in the process above are materials according to one embodiment, and the present invention is not limited thereto.

Additional embodiments of the present invention are described below with reference to FIGS. 5 to 9. Aspects and components of these additional embodiments, except as described below, may be the same or similar to those of the embodiment described above with reference to FIGS. 1 to 4, and, therefore, further detailed description thereof is omitted.

Figure 6A:
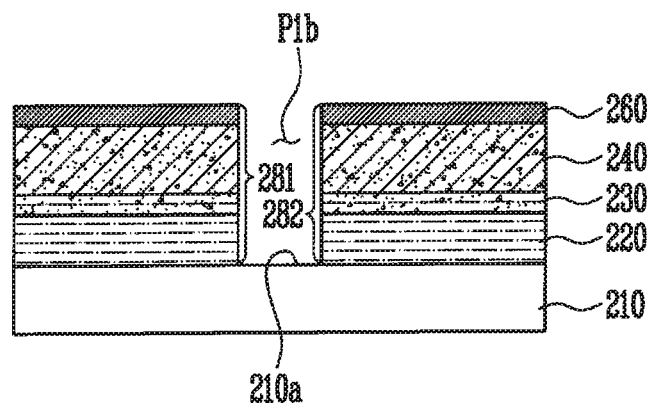
FIGS. 6A to 6C are views schematically illustrating a method of fabricating the solar cell of FIG. 5, according to an embodiment of the present invention.
Figure 6B:
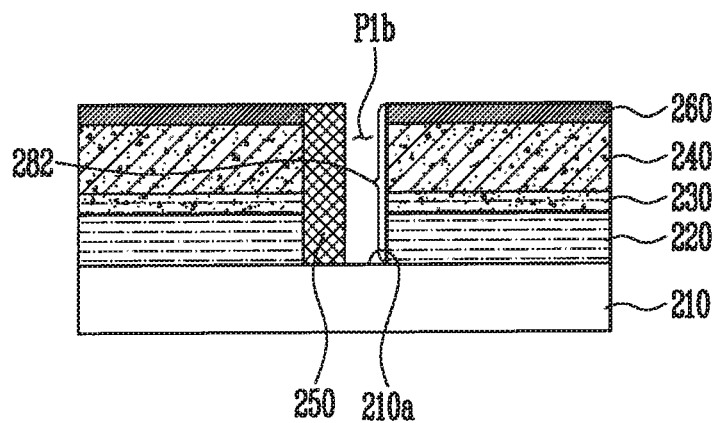
Figure 6C:
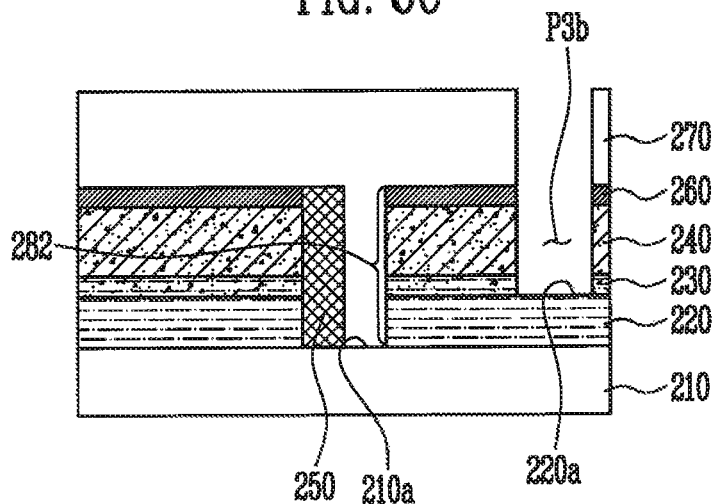
Figure 7:
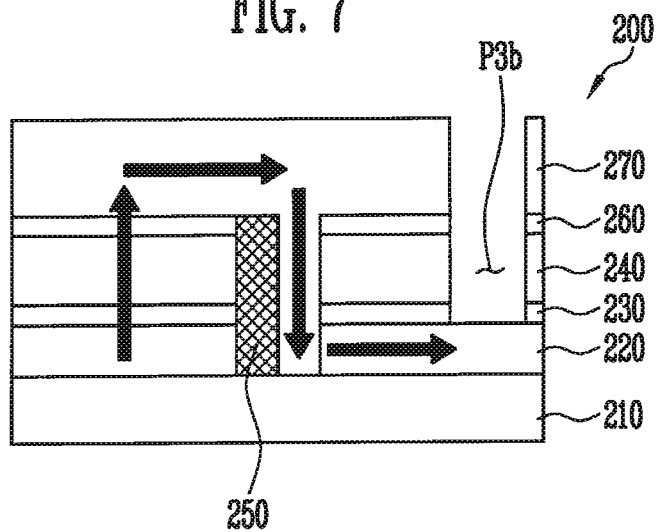
FIG. 7 is a schematic sectional view illustrating a state in which current flows in the solar cell of FIG. 5.

FIG. 5 is a sectional view of a solar cell according to another embodiment of the present invention. FIGS. 6A to 6C are sectional views schematically illustrating a method of fabricating the solar cell of FIG. 5, according to an embodiment of the present invention. FIG. 7 is a schematic sectional view illustrating a state in which current flows in the solar cell of FIG. 5.

Referring to FIGS. 5 to 6C, a solar cell 200 according to another embodiment of the present invention includes a back electrode layer 220, an alloy layer 230, a light absorbing layer 240, a buffer layer 260, and a front electrode layer 270, which are sequentially formed on a substrate 210 containing an alkali element. The solar cell 200 may include a first through-hole P1b formed through a patterning process and a third through-hole P3b spaced apart from the first through-hole P1b in a first direction. The first through-hole P1b may be formed by passing from the buffer layer 260 through the back electrode layer 220 so as to expose a top surface 210a of the substrate 210 before the front electrode layer 270 is formed. After the front electrode layer 270 is formed, the third through-hole P3b may expose at least one portion, such as a top surface 220a, of the back electrode layer 220 by passing through the front electrode layer 270, the buffer layer 260, the light absorbing layer 240, and the alloy layer 230.

The first through-hole P1b may include first and second surfaces 281 and 282, or first and second sides, spaced apart in the first direction so as to be opposite to each other. In this case, the second surface 282 is formed adjacent to the third through-hole P3b, and an insulating barrier 250 may cover the first surface 281 and the top surface 210a of the substrate 210 adjacent to the first surface 281. Therefore, the insulating barrier 250 is filled in a portion of the first through-hole P1b. In this case, the insulating barrier 250 may be formed not to be entirely filled in the first through-hole P1b but to cover only the first surface 281 of the first through-hole P1b. Thus, the insulating barrier 250 is not formed on the second surface 282 opposite to the first surface 281.

The solar cell 200 may further include the front electrode layer 270 formed on the buffer layer 260. The front electrode layer 270 may be formed to cover the second surface 282 of the first through-hole P1b and the top surface 210a of the substrate 210 adjacent to the second surface 282 by being filled in the first through-hole P1b. That is, the front electrode layer 270 may be filled in the remaining empty space in the first through-hole P1b, such that both the insulating barrier 250 and the front electrode layer 270 may be formed in the first through-hole P1b.

Referring to FIG. 7, in the solar cell 200 according to one embodiment, the flow of current may pass through the light absorbing layer 240 and the buffer layer 260 from the back electrode layer 220 positioned at the front of the neighboring back electrode layers 220 with the insulating barrier 250 interposed therebetween, and may then be connected to the front electrode layer 270. Subsequently, the flow of current may be connected to the back electrode layer 220 positioned at the rear of the neighboring back electrode layers 220. That is, insulation between the neighboring back electrode layers 220 is provided by the insulating barrier 250 formed on the first surface 281 of the first through-hole P1b. The front electrode layer 270 formed on the second surface 282 of the first through-hole P1b is connected to the front electrode layer 270 formed on the buffer layer 260, such that the flow of current between the neighboring back electrode layers 220 can be connected without being cut off.

In the solar cell 200 according to one embodiment, after the alkali element is formed up to the light absorbing layer 240, the alkali element contained in the substrate 210 may be diffused. Thus, the alkali element that has influence on the performance of the light absorbing layer 240 is uniformly or substantially uniformly distributed in the light absorbing layer 240. The first and third through-holes P1b and P3b are formed by performing the patterning process only two times, such that the flow of current is possible. Thus, the process efficiency can be improved by omitting the one-time patterning process. Further, the efficiency of the solar cell can be improved by omitting one through-hole through which power is not generated in the solar cell.

Figure 8:
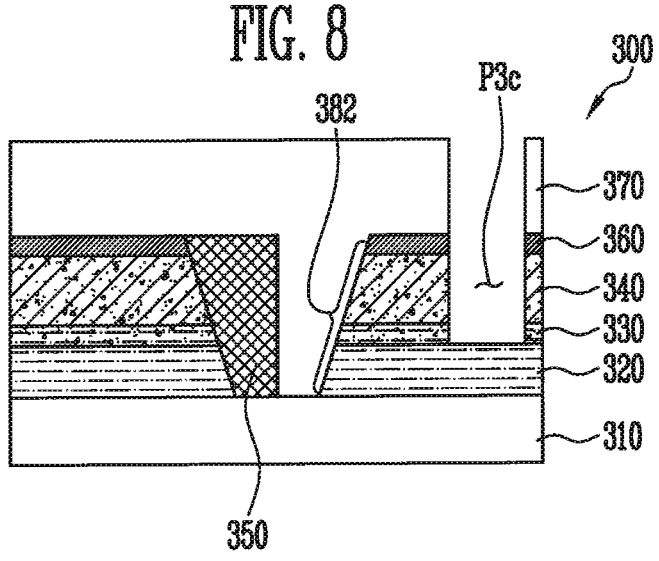
FIG. 8 is a sectional view of a solar cell according to another embodiment of the present invention.
Figure 9:
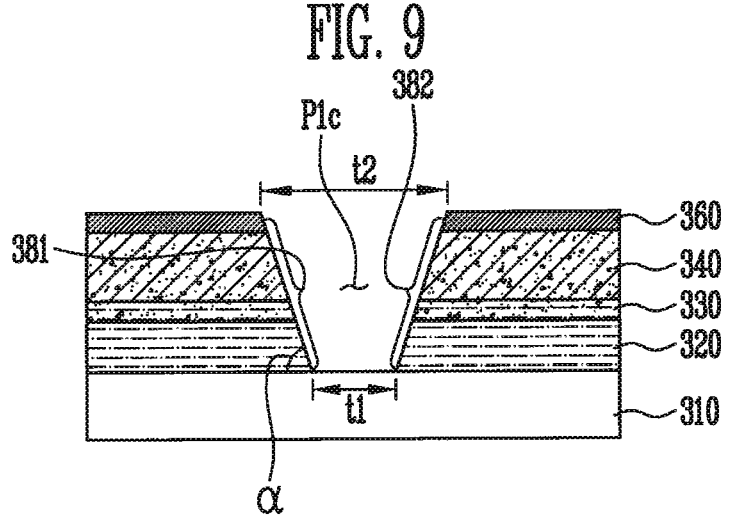
FIG. 9 is a sectional view of the solar cell of FIG. 8, shown in a state before an insulating barrier is provided.

FIG. 8 is a sectional view of a solar cell according to another embodiment of the present invention. FIG. 9 is a sectional view of the solar cell of FIG. 8, shown in a state before an insulating barrier is provided.

Referring to FIG. 8, a solar cell 300 according to another embodiment of the present invention includes a substrate 310 containing an alkali element, and a back electrode layer 320, an alloy layer 330, a light absorbing layer 340, a buffer layer 360 and a front electrode layer 370, which are sequentially formed on the substrate 310. The solar cell 300 according to one embodiment may include a first through-hole P1c formed by passing from the buffer layer 360 through the back electrode layer 320, and a third through-hole P3c formed by passing from the front electrode layer 370 through the alloy layer 330 while being spaced apart from the first through-hole P1c. In the solar cell 300 according to one embodiment, after the light absorbing layer 340 is formed, the alkali element is diffused into the light absorbing layer 340, such as through heating. In one embodiment, the alkali element is diffused before the first or third through-hole P1c or P3c is formed, and the diffusion speed of the alkali element can be equalized. Thus, the alkali element is uniformly or substantially uniformly contained in the light absorbing layer 340.

In one embodiment, at least one portion of the inner wall of the first through-hole P1c may be formed to be inclined. In one embodiment, for example, the first through-hole P1c is formed such that a width of the first through-hole P1c is narrowed in the direction toward the back electrode layer 320 from the buffer layer 360, such that the section of the first through-hole P1c may be formed in a trapezoid shape. The first through-hole P1c may include first and second surfaces 381 and 382, or sides, spaced apart in a first direction so as to be opposite to each other, and the first and second surfaces 381 and 382 may be formed to be inclined. The second surface 382 is provided adjacent to the third through-hole P3c, such that an insulating barrier 350 covers the first surface 381 and a portion of the substrate 310 adjacent to the first surface 381.

In one embodiment, for example, the first or second surface 281 or 282 of the first through-hole P1c may be formed to have an inclination angle $\alpha$ of 30 to 60 degrees with respect to the substrate 310. The first and second surfaces 281 and 282 of the first through-hole P1c are formed to be inclined, such that a contact area between interfaces is increased. Thus, the flow efficiency of current can be improved. On the other hand, if the inclination angle $\alpha$ exceeds 60 degrees, the amount of the light absorbing layer 340 removed increases, and therefore, an absorption amount of light is decreased. Accordingly, a power generation amount may be lowered. If the inclination angle $\alpha$ is less than 30 degrees, the contact area is hardly increased by the inclination. In one embodiment, a first lateral length t1 that is the width of a portion of the first through-hole P1c adjacent to the substrate 310 may be 50% or about 50% of a second lateral length t2 that is the width of a portion parallel with the interface of the buffer layer 360.

In the solar cell 300 according to one embodiment, the content of the alkali element in the light absorbing layer 340 can be equalized. Since the flow of current is possible using only the first and third through-holes P1c and P3c, it is possible to improve process efficiency and power generation efficiency of the solar cell per unit volume. Further, the inner wall of the first through-hole P1c is formed to be inclined, such that the efficiency of current can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A solar cell comprising:
a substrate;
a first electrode layer on the substrate;
a light absorbing layer on the first electrode layer;
an alloy layer between the first electrode layer and the light absorbing layer;
a buffer layer on the light absorbing layer;
a second electrode layer on the buffer layer;
a first through-hole formed through the buffer layer, the light absorbing layer, the alloy layer, and the first electrode layer to the substrate; and
an insulating barrier in at least one portion of the first through-hole,
wherein an interface of the insulating barrier is formed in parallel with an interface of the buffer layer, adjacent to the interface of the insulating barrier, and
wherein the light absorbing layer acts as a p-type semiconductor, and the second electrode layer acts as an n-type semiconductor.

2. The solar cell of claim 1, wherein the insulating barrier comprises at least one of $SiO_2$, $SiO_y$, $SiN_z$, and SION, where y and z are natural numbers.

3. The solar cell of claim 1, further comprising an alkali element diffused from the substrate into the light absorbing layer, the light absorbing layer comprising a CIGS compound.

4. The solar cell of claim 1, wherein the insulating barrier fills the first through-hole.

5. The solar cell of claim 1,
wherein a second through-hole is formed through the buffer layer and the light absorbing layer to the alloy layer, the second through-hole being spaced apart from the first through-hole in a first direction, and
wherein the second electrode layer contacts the alloy layer through the second through-hole.

6. The solar cell of claim 5, wherein a third through-hole is formed through the second electrode layer, the buffer layer, the light absorbing layer, and the alloy layer to the first electrode layer, the third through-hole being spaced apart from the second through-hole in the first direction.

7. The solar cell of claim 1, wherein a second through-hole is formed through the second electrode layer, the buffer layer, the light absorbing layer, and the alloy layer to the first electrode layer, the second through-hole being spaced apart from the first through-hole in a first direction.

8. The solar cell of claim 7, wherein the insulating barrier partially fills the first through-hole, and the second electrode layer fills a remaining portion of the first through-hole.

9. The solar cell of claim 8, wherein the insulating barrier is at a first side of the first through-hole, and the second electrode layer is at a second side of the first through-hole, the second side being spaced from the first side in the first direction.

10. The solar cell of claim 7, wherein at least a portion of an inner surface defining the first through-hole is inclined with respect to a surface of the substrate.

11. The solar cell of claim 10, wherein the at least a portion of the inner surface defining the first through-hole is inclined at an angle of 30 to 60 degrees with respect to the surface of the substrate.

12. The solar cell of claim 10, wherein a width of a portion of the first through-hole that is adjacent the substrate is about half of a width of another portion of the first through-hole that is at an interface with the buffer layer.

* * * * *